(12) United States Patent
Yeh et al.

(10) Patent No.: US 9,281,451 B2
(45) Date of Patent: Mar. 8, 2016

(54) LIGHT EMITTING ELEMENT AND FABRICATING METHOD THEREOF

(71) Applicant: Industrial Technology Research Institute, Hsinchu (TW)

(72) Inventors: Wen-Yung Yeh, Hsinchu County (TW); Kuo-Tung Tiao, Hsinchu County (TW); Chia-Hsin Chao, Taichung (TW); Hsi-Hsuan Yen, Taipei (TW); Ming-Hsien Wu, Tainan (TW); Jui-Ying Lin, Taipei (TW); Ying-Chien Chu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 72 days.

(21) Appl. No.: 13/762,395

(22) Filed: Feb. 8, 2013

(65) Prior Publication Data

US 2013/0214302 A1    Aug. 22, 2013

Related U.S. Application Data

(60) Provisional application No. 61/599,955, filed on Feb. 17, 2012.

(51) Int. Cl.
*H01L 33/48* (2010.01)
*H01L 25/075* (2006.01)
(Continued)

(52) U.S. Cl.
CPC .............. *H01L 33/48* (2013.01); *H01L 24/95* (2013.01); *H01L 25/0753* (2013.01);
(Continued)

(58) Field of Classification Search
CPC ... H01L 23/04; H01L 23/043; H01L 25/0753; H01L 27/15; H01L 33/48; H01L 33/483; H01L 33/486
See application file for complete search history.

(56) References Cited

U.S. PATENT DOCUMENTS

| 5,545,291 A | 8/1996 | Smith et al. |
| 7,727,804 B2 | 6/2010 | Smith |

(Continued)

FOREIGN PATENT DOCUMENTS

| TW | 200625569 | 7/2006 |
| TW | I281717 | 5/2007 |

(Continued)

OTHER PUBLICATIONS

Ehsan Saeedi et al., "Self-Assembled Inorganic Micro-Display on Plastic", MEMS 2007. Jan. 2007, p. 755-758.

(Continued)

*Primary Examiner* — Yu Chen
(74) *Attorney, Agent, or Firm* — Jianq Chyun IP Office

(57) ABSTRACT

A fabricating method of light emitting element. A substrate is provided. A plurality of first concaves and a plurality of second concaves are formed on the substrate, wherein a volume of each first concave is different from a volume of each second concave. A plurality of first light emitting diode chips and a plurality of second light emitting diode chips are provided, wherein a volume of each first light emitting diode chip is corresponding to the volume of each first concave, and a volume of each second light emitting diode chip is corresponding to the volume of each second concave. The first light emitting diode chips are moved onto the substrate such that the first light emitting diode chips go into the first concaves, and the second light emitting diode chips are moved onto the substrate such that the second light emitting diode chips go into the first concaves.

10 Claims, 10 Drawing Sheets

(51) Int. Cl.
*H01L 23/00* (2006.01)
*H01L 33/20* (2010.01)
*H01L 33/60* (2010.01)
*F21K 99/00* (2010.01)
*F21Y 101/02* (2006.01)
*F21Y 113/02* (2006.01)

(52) U.S. Cl.
CPC ............... *H01L 33/483* (2013.01); *F21K 9/90* (2013.01); *F21Y 2101/02* (2013.01); *F21Y 2113/02* (2013.01); *H01L 33/20* (2013.01); *H01L 33/60* (2013.01); *H01L 2224/95136* (2013.01); *H01L 2924/12041* (2013.01)

(56) References Cited

U.S. PATENT DOCUMENTS

| | | | |
|---|---|---|---|
| 7,943,052 | B2 | 5/2011 | Wu et al. |
| 2006/0237735 | A1* | 10/2006 | Naulin et al. .................... 257/98 |
| 2008/0023687 | A1* | 1/2008 | Choi et al. ...................... 257/13 |
| 2010/0059754 | A1* | 3/2010 | Lee et al. ......................... 257/59 |
| 2010/0060553 | A1 | 3/2010 | Zimmerman et al. |
| 2010/0118530 | A1* | 5/2010 | Nagai ............................ 362/235 |
| 2010/0327297 | A1* | 12/2010 | Yoshida et al. ................. 257/89 |
| 2011/0273410 | A1* | 11/2011 | Park et al. ...................... 345/204 |

FOREIGN PATENT DOCUMENTS

| | | |
|---|---|---|
| TW | 200731562 | 8/2007 |
| TW | M402494 | 4/2011 |

OTHER PUBLICATIONS

Wei Zheng et al., "Sequential shape-and-solder-directed self-assembly of functional microsystems", PNAS, Aug. 2004, p. 12814-12817.
Sean A. Stauth et al., "Self-assembled single-crystal silicon circuits on plastic", PNAS, Sep. 2006, p. 13922-13927.
Xiaorong Xiong et al., "Multi-Batch Self-Assembly for Microsystem Integration", Department of Chemical Engineering, University of Washington, Sep. 2002, p. 1-4.
Ehsan Saeedi et al., "Self-Assembled Single-digit micro-display on plastic", Proc. SPIE 6885, Jan. 2008, p. 688509-1-688509-12.
Sang-Il Park et al., "Printed Assemblies of Inorganic Light-Emitting Diodes for Deformable and Semitransparent Displays", Science 325, Aug. 2009, 51 pages.
Jongseung Yoon et al., "GaAs photovoltaics and optoelectronics using releasable multilayer epitaxial assemblies", Nature, May 2010, p. 329-334.

* cited by examiner

LIGHT EMITTING ELEMENT AND FABRICATING METHOD THEREOF

CROSS-REFERENCE TO RELATED APPLICATION

This application claims the priority benefits of U.S. provisional application Ser. No. 61/599,955, filed on Feb. 17, 2012. The entirety of the above-mentioned patent applications is hereby incorporated by reference herein and made a part of this specification.

BACKGROUND

1. Technical Field

The technical field relates to a light emitting element and a fabricating method thereof, and more particularly, to a light emitting diode (LED) light emitting element and a fabricating method thereof.

2. Background

A self-luminous display technology is a display technology that uses red, green and blue light emitting diode chips as display pixels, and has features of energy-saving, high contrast, wide color gamut, vivid color and fast response time; therefore, more and more electronic devices (such as TV) are using the light emitting diodes of self-luminous display technology.

With different materials and growth conditions, the red, green and blue light-emitting diodes are not easily to be grown on a same substrate for forming display pixel arrays, and thus after fabrications of the red, green and blue light-emitting diodes are completed, chips are transferred onto a display driving substrate, such as a thin film transistor (TFT) backplane. However, following a refinement of the display pixels and an enhancement of resolution, the fabricating method for transferring the chips has already faced a bottleneck of insufficient throughput. As such, how to increase the throughput of the pixel arrays in response to the refinement of the display pixels and the enhancement of the resolution is substantially an important topic of current light emitting diode self-luminous display devices.

SUMMARY

A light emitting element and a fabricating method thereof are provided, such that the throughput of the light emitting element is improved.

The fabricating method of the light emitting element includes the following steps. A substrate is provided. A plurality of first concaves and a plurality of second concaves are formed on the substrate, wherein a volume of each first concave is different from a volume of each second concave. A plurality of first light emitting diode chips and a plurality of second light emitting diode chips are provided, wherein a volume of each first light emitting diode chip is corresponded to the volume of each first concave, and a volume of each second light emitting diode chip is corresponded to the volume of each second concave. The first light emitting diode chips are moved onto the substrate so that the first light emitting diode chips go into the first concaves, and the second light emitting diode chips are moved onto the substrate so that the second light emitting diode chips go into the second concaves.

In an embodiment, a shape of each first concave is different from a shape of each second concave.

The light emitting element includes a substrate, a plurality of first light emitting diode chips and a plurality of second light emitting diode chips. The substrate has a plurality of first concaves and a plurality of second concaves, wherein a volume of each first concave is different from a volume of each second concave. A volume of each first light emitting diode chip is corresponded to the volume of each first concave. The first light emitting diode chips are located within the first concaves. A volume of each second light emitting diode chip is corresponded to the volume of each second concave. The second light emitting diode chips are located within the second concaves.

In an embodiment, a shape of each first concave is different from a shape of each second concave.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
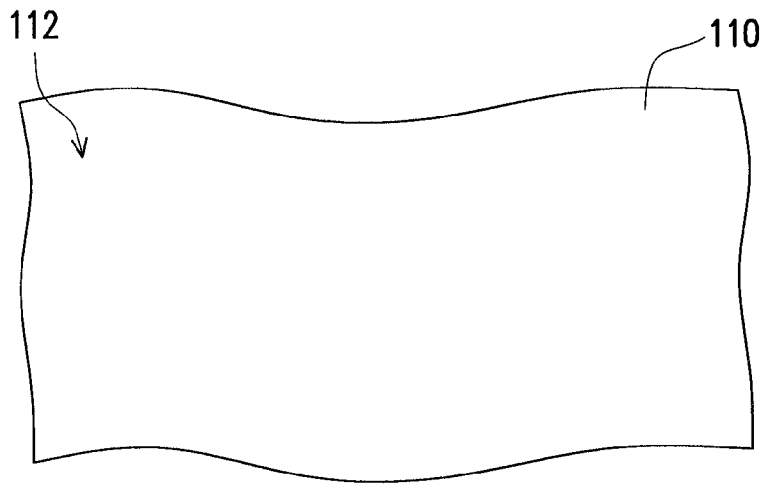
FIG. 1A to FIG. 1F are flow diagrams illustrating a fabricating method of a light emitting element according to an exemplary embodiment.
Figure 1B:
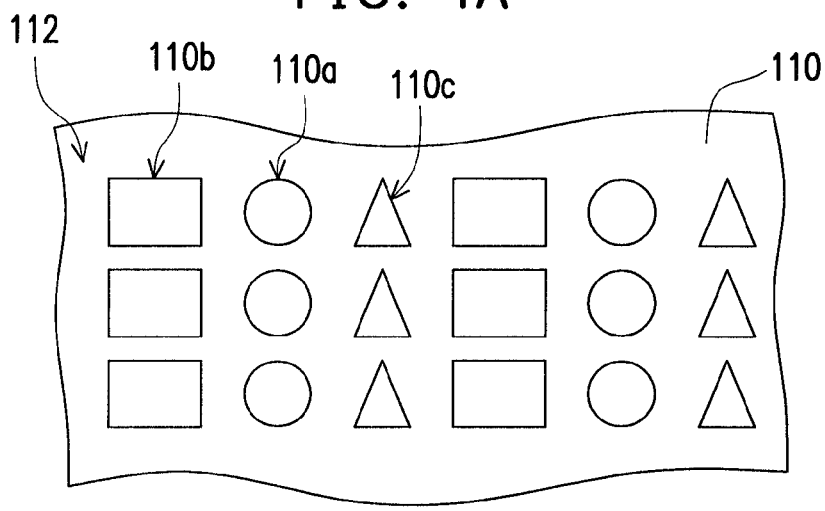

FIG. 1A to FIG. 1F are flow diagrams illustrating a fabricating method of a light emitting element according to an exemplary embodiment. Firstly, as depicted in FIG. 1A, a substrate 110 is provided. Next, as depicted in FIG. 1B, a plurality of first concaves 110a, a plurality of second concaves 110b and a plurality of third concaves 110c are formed on the substrate 110, wherein a volume and a shape of each first concave 110a are different from a volume and a shape of each second concave 110b, and a volume and a shape of each third concave 110c are different from the volume and the shape of each first concave 110a and the volume and the shape of each second concave 110b. In FIG. 1B, only six first concaves 110a, six second concaves 110b and six third concaves 110c are illustrated, however, they have only been taken as an example; substantially, the first concaves 110a, the second concaves 110b and the third concaves 110c may be much more in numbers.

Figure 1C:
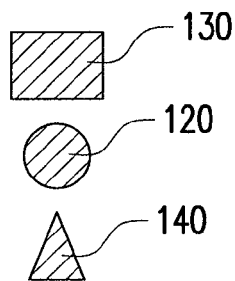

As depicted in FIG. 1C, a plurality of first light emitting diode chips 120, a plurality of second light emitting diode chips 130 and a plurality of third light emitting diode chips 140 are provided, wherein a volume and a shape of each first light emitting diode chip 120 are corresponded to the volume an the shape of each first concave 110a, a volume and a shape of each second light emitting diode chip 130 are corresponded to the volume and the shape of each second concave 110b, and a volume and a shape of each third light emitting diode chip 140 are corresponded to the volume and the shape of third concave 110c. Each first light emitting diode chip 120, each second light emitting diode chip 130 and each third light emitting diode chips 140 of present embodiment, for example, are respectively a red light emitting diode chip, a blue light emitting diode chip and a green light emitting diode chip. In other embodiments, each first light emitting diode chip 120, each second light emitting diode chip 130 and each third light emitting diode chip 140 may respectively be the red light emitting diode chip, the green light emitting diode chip and the blue light emitting diode chip, or respectively be the blue light emitting diode chip, the red light emitting diode chip and the green light emitting diode chip, or respectively be the blue light emitting diode chip, the green light emitting diode chip and the red light emitting diode chip, or respectively be the green light emitting diode chip, the red light emitting diode chip and the blue light emitting diode chip, or respectively be the green light emitting diode chip, the blue light emitting diode chip and the red light emitting diode chip, but the disclosure is not limited thereto. For a more concise description, only a first light emitting diode chip 120, a second light emitting diode chip 130 and a third light emitting diode chip 140 are illustrated in FIG. 1C, and are only taken as an example; substantially, the first light emitting diode chip 120, the second light emitting diode chip 130 and the third light emitting diode chips 140 are more in numbers.

Figure 1D:
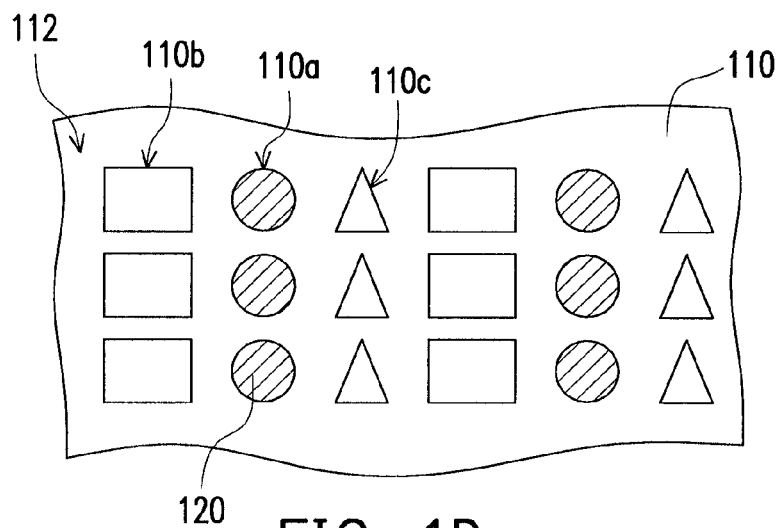
Figure 1E:
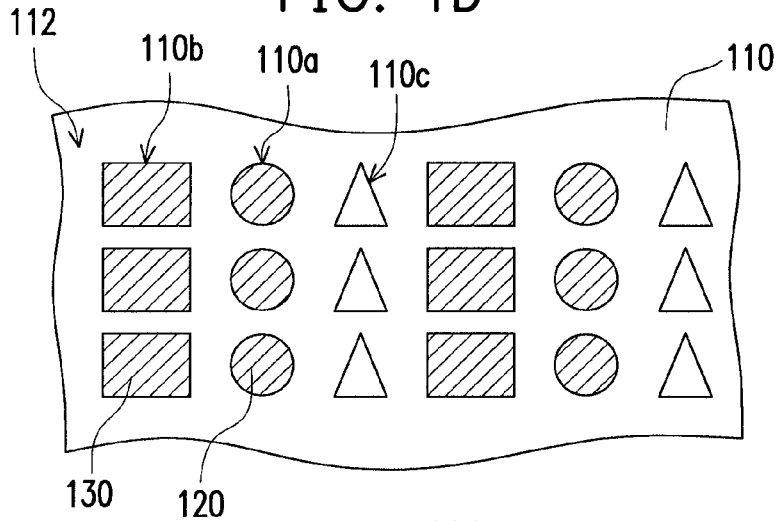
Figure 1F:
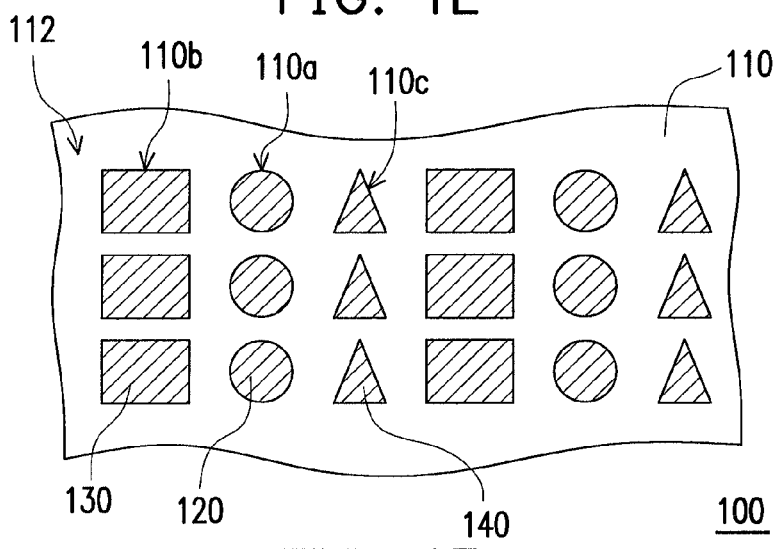

As depicted in FIG. 1D, the first light emitting diode chips 120 are moved onto the substrate 110 so that the first light emitting diode chips 120 go into the first concaves 110a. As depicted in FIG. 1E, the second light emitting diode chips 130 are moved onto the substrate 110 so that the second light emitting diode chips 130 go into the second concaves 110b. As depicted in FIG. 1F, the third light emitting diode chips 140 are moved onto the substrate 110 so that the third light emitting diode chips 140 go into the third concaves 110c, thereby partially completed the fabrication of the light emitting element 100. In the present embodiment, the first light emitting diode chips 120, the second light emitting diode chips 130 and the third light emitting diode chips 140, for example, are moved onto the substrate 110 by using fluids, and in other embodiments, the light emitting diode chips may be moved onto the substrate via other suitable methods, and the disclosure is not limited thereto.

In detail, in the present embodiment, each first concave 110a, each second concave 110b and each third concave 110c open at a surface 112 of the substrate 110. A method of forming the first concaves 110a, the second concaves 110b and the third concaves 110c includes the following steps. A profile (illustrated as a circle in FIG. 1B) of each first concave 110a at the surface 112 is corresponded to a profile (illustrated as a circle in FIG. 1C) of a cross section of each first light emitting diode chip 120. A profile (illustrated as a rectangle in FIG. 1B) of each second concave 110b at the surface 112 is corresponded to a profile (illustrated as a rectangle in FIG. 1C) of a cross section of each second light emitting diode chip 130 and different from the profile of each first concave 110a at the surface 112. A profile (illustrated as a triangle in FIG. 1B) of each third concave 110c at the surface 112 is corresponded to a profile (illustrated as a triangle in FIG. 1C) of a cross section of each third light emitting diode chip 140 and different from the profile of each first concave 110a at the surface 112 and the profile of each second concave 110b at the surface 112. As a result, the first concaves 110a, the second concaves 110b and the third concaves 110c are enable to have shapes respectively corresponded to the first light emitting diode chips 120, the second light emitting diode chips 130 and the third light emitting diode chips 140.

The aforementioned method is to fabricate the first concaves 110a, the second concaves 110b and the third concaves 110c of different volumes and shapes on the substrate 110, and the volume and the shape of the first light emitting diode chips 120, the volume and the shape of the second light emitting diode chips 130 and the volume and the shape of the third light emitting diode chips 140 are respectively corresponded to the volume and the shape of the first concaves 110a, the volume and the shape of the second concaves 110b and the volume and the shape of the third concaves 110c. As a result, when the first light emitting diode chips 120, the second light emitting diode chips 130 and the third light emitting diode chips 140 are moved onto the substrate 110, the first light emitting diode chips 120 selectively go into the first concaves 110a corresponded thereto, the second light emitting diode chips 130 selectively go into the second concaves 110b corresponded thereto, and the third light emitting diode chips 140 selectively go into the second concaves 110c corresponded thereto, so as to enable the first light emitting diode chips 120, the second light emitting diode chips 130 and the third light emitting diode chips 140 to be quickly and correctly assembled onto the substrate 110 via an automatic alignment method, and thus may effectively enhance a throughput of the light emitting element 100.

The light emitting element 100 of the present embodiment, as illustrated in FIG. 1F, includes a substrate 110, a plurality of first light emitting diode chips 120, a plurality of second light emitting diode chips 130 and a plurality of third light emitting diode chips 140. The substrate 110 has a plurality of first concaves 110a, a plurality of second concaves 110b and a plurality of third concaves 110c, wherein a volume and a shape of each first concave 110a are different from a volume and a shape of each second concave 110b, and a volume and a shape of each third concave 110c are different from the volume and the shape of each first concave 110a and the volume and the shape of each second concave 110b. A volume and a shape of each first light emitting diode chip 120 are corresponded to the volume and the shape of each first concave 110a. The first light emitting diode chips 120 are located within the first concaves 110a. A volume and a shape of each second light emitting diode chip 130 are corresponded to the volume and the shape of each second concave 110b. The second light emitting diode chips 130 are located within the second concaves 110b. A volume and a shape of each third light emitting diode chip 140 are corresponded to the volume and the shape of each third concave 110c. The third light emitting diode chips 140 are located within the third concaves 110c.

Figure 2:
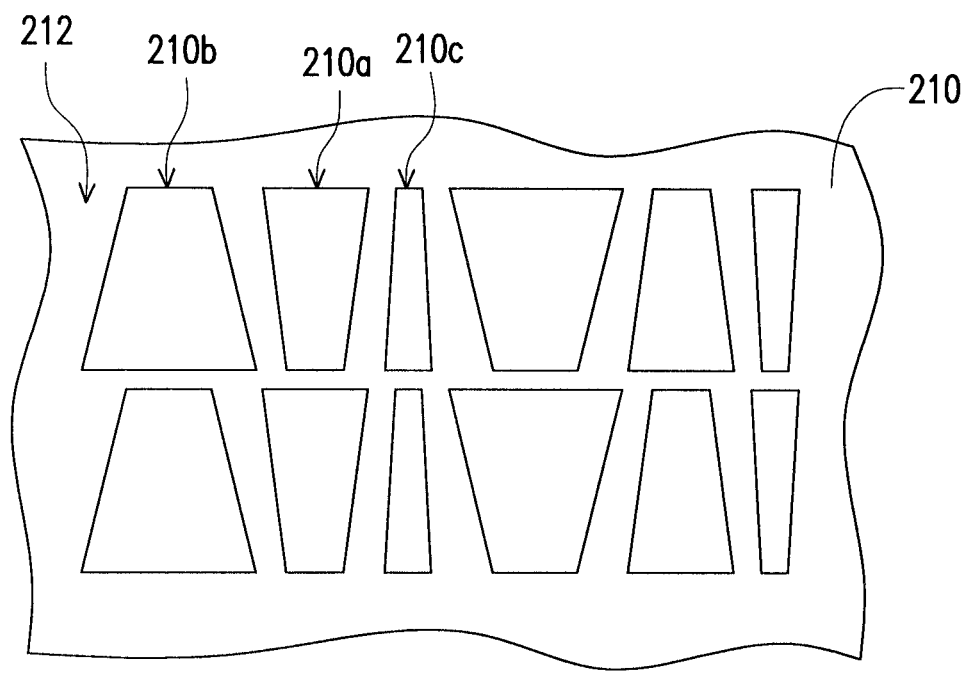
FIG. 2 and FIG. 3 are respectively schematic diagrams illustrating a substrate and a plurality of light emitting diode chips according to another exemplary embodiment.
Figure 3:
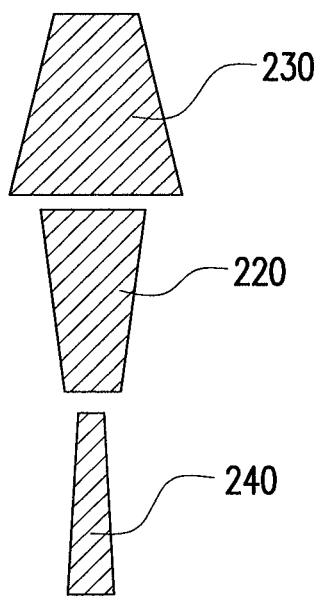

The disclosure is not intended to limit the shapes of the concave and the shapes of the light emitting diode chips on the substrate, and examples accompanied with figures are provided below to further describe the disclosure. FIG. 2 and FIG. 3 are respectively schematic diagrams illustrating a substrate and a plurality of light emitting diode chips according to another exemplary embodiment. Referring to FIG. 2, a substrate 210 of the present embodiment has a plurality of first concaves 210a, a plurality of second concaves 210b and a plurality of third concaves 210c, each first concave 210a, each second concave 210b and each third concave 210c are all trapezoids, and profiles of each first concave 210a, each second concave 210b and each third concave 210c at a surface 216 of the substrate 210 are different from each others. Referring to FIG. 3, profiles of a first light emitting diode chip 220, a second light emitting diode chip 230 and a third light emitting diode chip 240 of the present embodiment are all trapezoids and are respectively corresponded to the profiles of each first concave 210a, each second concave 210b and each third concave 210c. With this, the first light emitting diode chips 220, the second light emitting diode chips 230 and the third light emitting diode chips 240 can be quickly, correctly and respectively assembled to the first concaves 210a, the second concaves 210b and the third concaves 210c on the substrate 210 via an automatic alignment method.

Figure 4:
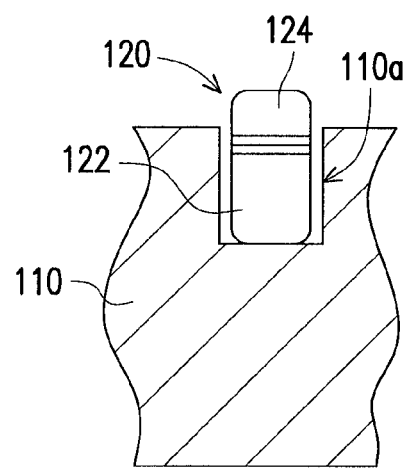
FIG. 4 is a partial cross sectional view of the light emitting element of FIG. 1F.

In detail, within the concaves of the substrate, there is a plurality of electrodes configured to electrically connect to the light emitting diode chips corresponded thereof, and specific descriptions accompanied with figures are provided below. FIG. 4 is a partial cross sectional view of the light emitting element of FIG. 1F. Referring to FIG. 4, the light emitting diode chip (e.g., the first light emitting diode chip 120 in FIG. 4) of the present embodiment has a positive electrode terminal 122 and a negative electrode terminal 124, and a configuration of the light emitting diode chip is a vertical type, such that the positive electrode terminal 122 is located within the concave (e.g., the first concave 110a in FIG. 4) of the substrate 110 and electrically connected to the substrate 110. The configuration of the light emitting diode chip may also be a horizontal type, and examples accompanied with figures are provided below to further describe the disclosure.

Figure 5:
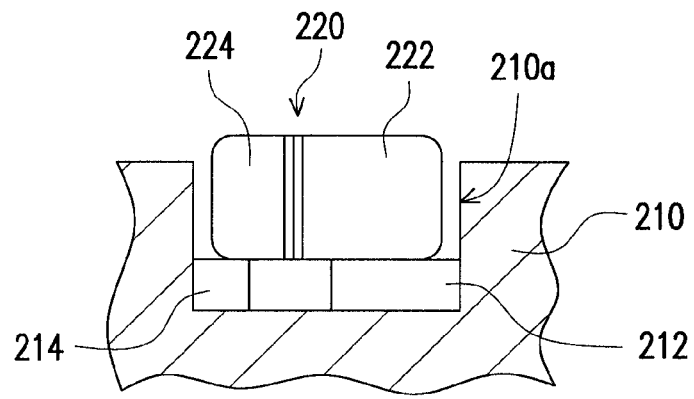
FIG. 5 is a partial cross sectional view of the light emitting element of FIG. 2.
Figure 6:
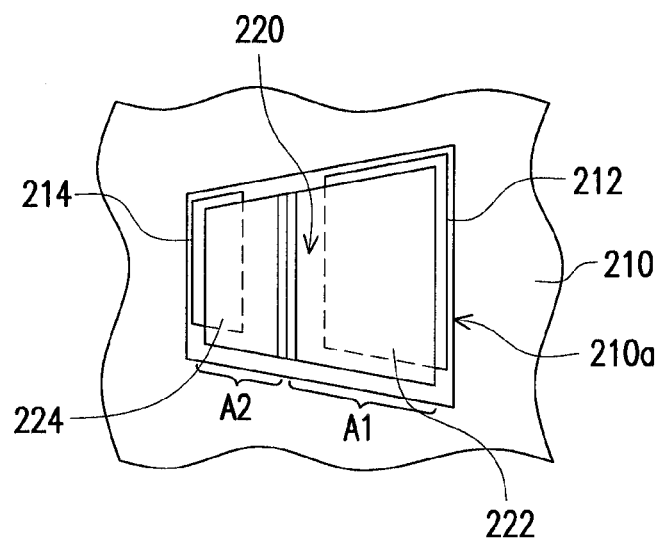
FIG. 6 is a top view of the light emitting element of FIG. 5.

FIG. 5 is a partial cross sectional view of the light emitting element of FIG. 2. FIG. 6 is a top view of the light emitting element of FIG. 5. Referring to FIG. 5 and FIG. 6, a configuration of light emitting diode chip (e.g., the first light emitting diode chips 220 in FIG. 5 and FIG. 6) of the present embodiment is the horizontal type, such that a positive electrode terminal 222 and a negative electrode terminal 224 are both located within the concave (e.g., the first concave 210a in FIG. 5 and FIG. 6) of the substrate 210 and electrically connected to the substrate 210.

Furthermore, shapes of the concaves of the substrate may be designed to be asymmetric, so that the positive electrode terminal and the negative electrode terminal of the horizontally configured light emitting diode chip can automatically, correctly and respectively aligned to the electrodes within the concaves; the following has taken the first concaves 210a and the first light emitting diode chips 220 of FIG. 5 and FIG. 6 as an example for the description. In a process of fabricating the light emitting element, a first electrode 212 and a second electrode 214 are respectively disposed at a first region A1 and a second region A2 within the first concaves 210a of substrate 210, wherein a shape of the first region A1 is corresponded to the shape of the positive electrode terminal 222 of the first light emitting diode chip 220, and a shape of the second region A2 is corresponded to the shape of the negative electrode terminal 224 of the first light emitting diode chips 220. The shape of the first region A1 is different from the shape of the second region A2, such that the shape of the first concave 210a is asymmetric. With this, the first light emitting diode chips 220 is able to be automatically assembled to the first concave 210a with correct direction, so that the positive electrode terminal 222 and the negative electrode terminal 224 of the first light emitting diode chip 220 may respectively and correctly be in contact with and electrically connect to the first electrode 212 and the second electrode 214. The following accompanied with figures describes other methods used for automatically aligning the light emitting diode chips and the electrodes within the concaves.

Figure 7:
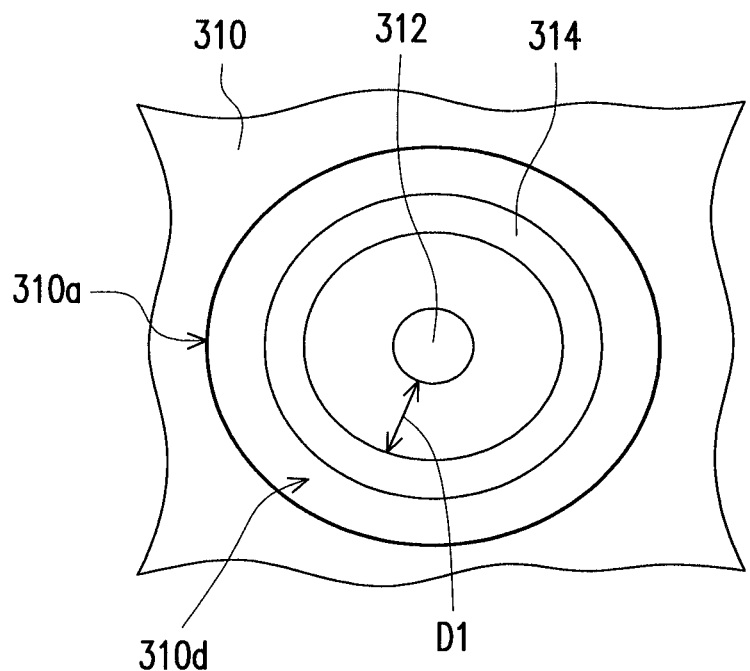
FIG. 7 is a partial cross sectional view of a substrate according to another exemplary embodiment.
Figure 8:
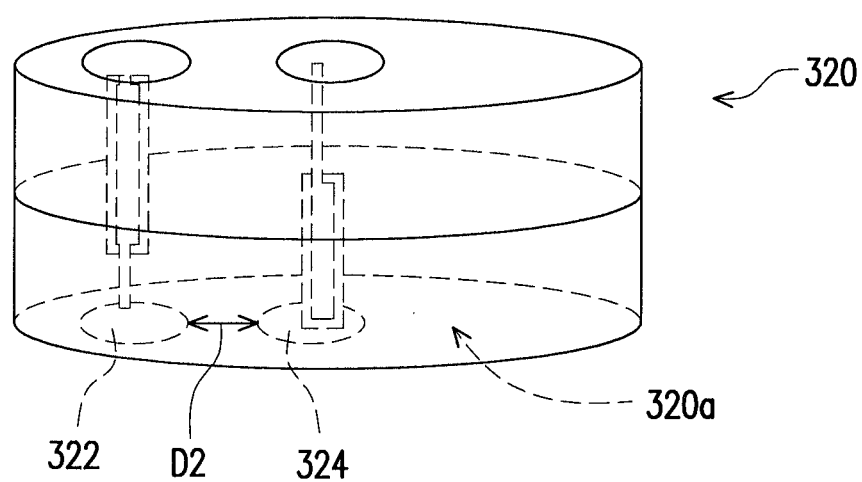
FIG. 8 illustrates a light emitting diode chip corresponded to a concave of FIG. 7.

FIG. 7 is a partial cross sectional view of a substrate according to another exemplary embodiment. FIG. 8 illustrates a light emitting diode chip corresponded to a concave of FIG. 7. Referring to FIG. 7 and FIG. 8, in the process of fabricating the light emitting element, a positive electrode pad 322 and a negative electrode pad 324 may be disposed at a surface 320a of the light emitting diode chip (e.g., a first light emitting diode chip 320 in FIG. 8), wherein one (illustrated with the negative electrode pad 324) of the positive electrode pad 322 and the negative electrode pad 324 is located at the geometric center of the surface 320a. In addition, a first electrode 312 is disposed at the geometric center of a bottom surface 310d of the concave (e.g., a first concave 310a in FIG. 7) of the substrate 310, and a second electrode 314 is disposed at the bottom surface 310d, wherein the second electrode 314 appears to be in ring-shaped and symmetrically surrounds the first electrode 312, and a distance D1 between the first electrode 312 and the second electrode 314 equals or similar to a distance D2 between the positive electrode pad 322 and the negative electrode pad 324. With this, when the first light emitting diode chip 320 is assembled within the first concave 310a, the positive electrode pad 322 and the negative electrode pad 324 automatically and correctly aligned to the first electrode 312 and the second electrode 314, so that the first electrode 312 is electrically connected to one of the positive electrode pad 322 and the negative electrode pad 324, and the second electrode 314 is electrically connected to the another one of the positive electrode pad 322 and the negative electrode pad 324. Moreover, positive and negative electrodes of periodically staggered arrangement may also be disposed within the first concave of the substrate, wherein a distance between the positive and negative electrodes is greater than a position offset of the first light emitting diode chip going within the first concave, such that when the positive and negative electrodes on the first light emitting diode chip go into the first concave, the positive and negative electrodes is adapted to respectively contact the positive and negative electrodes of periodically staggered arrangement, and thus achieve an effect of automatically aligning the light emitting diode chip and the electrode within the concave.

The concaves mentioned in the above embodiments may all be formed with cambered surfaces, and reflective layers may be disposed within the concaves so as to reflect lights emitted by the light emitting diode chips, and thereby enhance a light output efficiency of the light emitting diode chips and enable the light emitting diode chips to have a favorable light output collimation. Further example accompanied with figures is provided below to further describe the disclosure.

Figure 9:
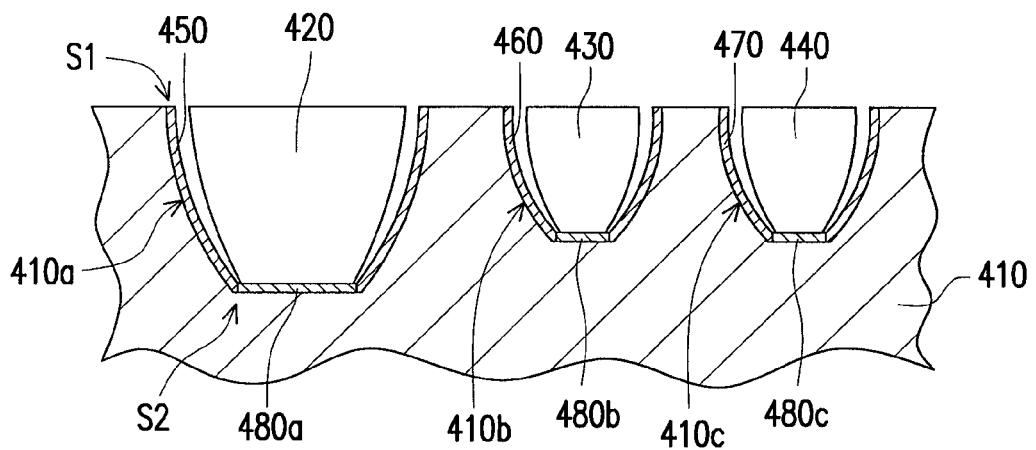
FIG. 9 is a partial cross sectional view illustrating a light emitting element according to another exemplary embodiment.

FIG. 9 is a partial cross sectional view illustrating a light emitting element according to another exemplary embodiment. Referring to FIG. 9, a substrate 410 of the present embodiment has first concaves 410a, second concaves 410b and third concaves 410c respectively configured to accommodate first light emitting diode chips 420, second light emitting diode chips 430 and third light emitting diode chips 440. For a more concise description, only one first concave 410a, one second concave 410b, one third concave 410c, one first light emitting diode chip 420, one second light emitting diode chip 430 and one third light emitting diode chip 440 are illustrated in FIG. 9; and substantially, amounts of the first concaves 410a, the second concaves 410b, the third concaves 410c, the first light emitting diode chips 420, the second light emitting diode chips 430 and the third light emitting diode chips 440 of the present embodiment, for example, are pluralities. The first light emitting diode chips 420, the second light emitting diode chips 430 and the third light emitting diode chips 440, for example, respectively are red light emitting diode chips, blue light emitting diode chips and green light emitting diode chips. In a process of forming the first concave 410a, the second concave 410b and the third concaves 410c, as depicted in FIG. 9, an inner wall of the first concaves 410a, inner wall of the second concave 410b and inner wall of the third concave 410c are formed into cambered surfaces, and a reflective layer 450, a reflective layer 460 and a reflective layer 470 are respectively formed at the inner wall of the first concave 410a, the inner wall of the second concave 410b and the inner wall of the third concave 410c. By adjusting a curvature of the inner wall of the first concave 410a, a curvature of the inner wall of the second concave 410b and a curvature of the inner wall of the third concave 410c, light emitted by the first light emitting diode chip 420, the second light emitting diode chip 430 and the third light emitting diode chip 440, through reflections of the reflective layer 450, the reflective layer 460 and the reflective layer 470, have a favorable light output collimation and light output efficiency.

In a process of fabricating the light emitting element, an electrode 480a, an electrode 480b and an electrode 480c may be disposed within the first concave 410a, the second concave 410b and the third concave 410c, and the electrode 480a, the electrode 480b and the electrode 480c are respectively configured to be electrically connected to the first light emitting diode chip 420, the second light emitting diode chip 430 and the third light emitting diode chip 440. In addition, the reflective layer 450, the reflective layer 460 and the reflective layer 470 may respectively be electrically connected to the electrode 480a, the electrode 480b and the electrode 480c. With this, under a condition when the light emitting diode chip (the first light emitting diode chip 420, the second light emitting diode chip 430o or the third light emitting diode chips 440) is not really in contact with the electrode (the electrode 480a, the electrode 480b or the electrode 480c), the light emitting diode chip can smoothly be electrically connected to the electrode through the contact of the light emitting diode chip (the first light emitting diode chip 420, the second light emitting diode chip 430 or the third light emitting diode chip 440) and the reflective layer (the reflective layer 450, the reflective layer 460 or the reflective layer 470).

Figure 10:
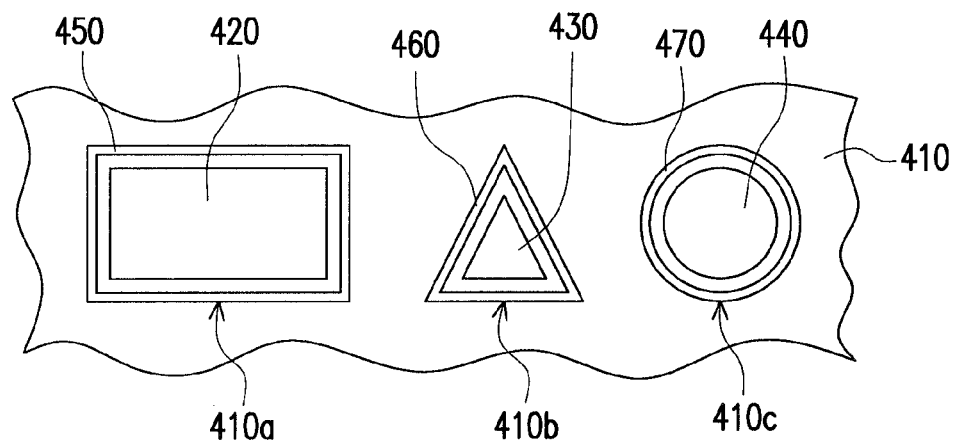
FIG. 10 is a top view of the light emitting element of FIG. 9.

FIG. 10 is a top view of the light emitting element of FIG. 9. Referring to FIG. 10, the first concave 410a, the second concave 410b and the third concave 410c of the present embodiment, for example, respectively have cross sections of different profiles (respectively illustrated as a rectangular cross section, a triangular cross section and a circular cross section), and shapes of the first light emitting diode chip 420, the second light emitting diode chip 430 and the third light emitting diode chips 440 are respectively corresponded to the profiles of the first concave 410a, the second concave 410b and the third concaves 410c. As such, in the process of fabricating the light emitting element, the first light emitting diode chip 420, the second light emitting diode chip 430 and the third light emitting diode chip 440 can be quickly and correctly be assembled onto the substrate 410 via an automatic alignment method. The blue light emitting diode chip and the green light emitting diode chip generally have similar thicknesses, and the present embodiment respectively corresponds the triangular concave (the second concave 410b) and the circular concave (the third concave 410c) of higher light extraction efficiencies to the blue light emitting diode chip (the second light emitting diode chip 430) and the green light emitting diode chip (the third light emitting diode chip 440). In addition, a thickness of the red light emitting diode chip is generally greater than the thickness of the blue light emitting diode chip and the thickness of the green light emitting diode chip; and therefore, as depicted in FIG. 9, the first concave 410a corresponded to the red light emitting diode chip (the first light emitting diode chip 420) may be formed into a deeper concave, the second concave 410b corresponded to the blue light emitting diode chip (the second light emitting diode chip 430) and the third concave 410c corresponded to the green light emitting diode chip (the third light emitting diode chip 440) may be formed into shallower concaves, so as to further enhance an accuracy of the automatic alignment of the light emitting diode chips.

The electrode 480a, the electrode 480b and the electrode 480c depicted in FIG. 9 may respectively and selectively use different materials to enable the electrode 480a, the electrode 480b and the electrode 480c to adapt to be soldered with different first soldering temperature, second soldering temperature and third soldering temperature. In the process of fabricating the light emitting element, when the light emitting diode chips are moved onto the substrate, if a portion of the light emitting diode chips go into concaves not corresponded thereof, then differences in the soldering temperatures of the electrode 480a, the electrode 480b and the electrode 480c may be used as a basis of assembly accuracy, and this is further described in detail below. For example, if a portion of the first light emitting diode chips 420 correctly go into the first concaves 410a corresponded thereof, and another portion of the first light emitting diode chips 420 incorrectly go into the second concaves 410b or third concaves 410c that is not corresponded thereof, then by using the first soldering temperature to solder the electrode 480a, the electrode 480b and the electrode 480c, the first light emitting diode chip 420 currently located within the first concave 410a is combined to the electrode 480a via the soldering, and the first light emitting diode chip 420 located within the second concave 410b or the third concave 410c is not combined to the electrode 480b and the electrode 480c and may be removed. Next, the assembly of the light emitting diode chips are continued until all the first concaves 410a are correctly assembled with the first light emitting diode chips 420 corresponded thereof. Similarly, all the second concaves 410b may be correctly assembled with the second light emitting diode chips 430 corresponded thereof by applying the second soldering temperature, and all the third concaves 410c may be correctly assembled with the third light emitting diode chips 440 corresponded thereof by applying the third soldering temperature. As aforesaid, by using the differences between the soldering temperatures of the electrode 480a, the electrode 480b and the electrode 480c as the basis of assembling the light emitting diode chips, the accuracy in the assembly may be enhanced and thereby enhancing the throughput.

Figure 11:
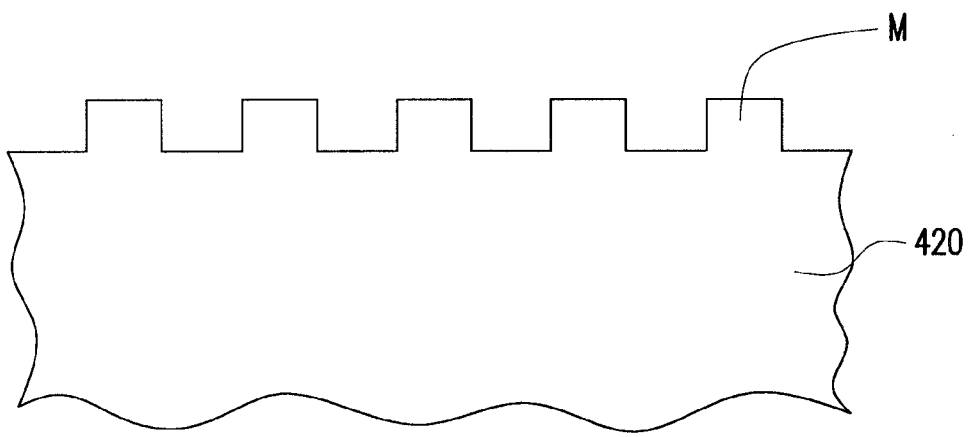
FIG. 11 is a partial enlarged diagram of a plurality of first light emitting diode chips of FIG. 9.

FIG. 11 is a partial enlarged diagram of a plurality of first light emitting diode chips of FIG. 9. Referring to FIG. 11, in the process of fabricating the light emitting element, optical microstructures M may be formed on the first light emitting diode chip 420 so as to enhance the light output efficiency. The second light emitting diode chip 430 and the third light emitting diode chip 440 may also form the same or similar optical microstructures M for enhancing the light output efficiency. The optical microstructures may be in an orderly array form or an irregular arrangement, the disclosure is not limited thereto. For example, the optical microstructures may be surface roughening structures, periodic micro-structures, periodic pore structures, periodic columnar structures or periodic cone structures.

Referring to FIG. 9, in the present embodiment, the first concave 410a has an opening terminal S1 and a bottom surface S2. In the process of fabricating the light emitting element, as depicted in FIG. 9, the first concave 410a may gradually shrink from the opening terminal S1 toward to the bottom surface S2, so that the first light emitting diode chip 420 can smoothly go into the first concave 410a, and the light emitted by the first light emitting diode chip 420 can indeed be reflected by the reflective layer 450 on the inner wall of the first concave 410a. The second concave 410b and the third concave 410c, may also as depicted in FIG. 9, shrink from the opening terminal toward to the bottom surface, thereby achieving the same effect as described above. In addition, in the embodiment of FIG. 9, a size of the first concave 410a is designed to be slightly greater than a size of the first light emitting diode chip 420, so as to avoid the first light emitting diode chip 420 and the first concaves 410a from being unable to be successfully assembled due to fabrication tolerances. The second concave 410b and the third concave 410c, also as depicted in FIG. 9, are designed to be slightly greater than sizes of the second light emitting diode chip 430 and the third light emitting diode chip 440, so that the same effect as described above may be achieved.

FIG. 12A to FIG. 12F are flow diagrams illustrating a fabricating method of a light emitting element according to another exemplary embodiment. Amounts of first light emitting diode chips 520, second light emitting diode chips 530, third light emitting diode chips 540, first concaves 510a, second concaves 510b and third concaves 510c illustrated in FIG. 12A to FIG. 12F are only provided as an example, and in the other embodiments, the amounts thereof are in greater numbers. Referring to a light emitting element 500 illustrated in FIG. 12F, a thickness of the first light emitting diode chips 520 thereof is greater than a thickness of the second light emitting diode chips 530, and the thickness of the second light emitting diode chips 530 is greater than a thickness of the third light emitting diode chips 540. In a fabrication process of the present embodiment, the first concaves 510a, the second concaves 510b and the third concaves 510c of the substrate 510 are fabricated as respectively having different depths and are corresponded to the first light emitting diode chips 520, the second light emitting diode chips 530 and the third light emitting diode chips 540 of different thicknesses, so as to achieve an assembly effect of automatically aligning the light emitting diode chips, and this is further described in detail below.

Figure 12A:
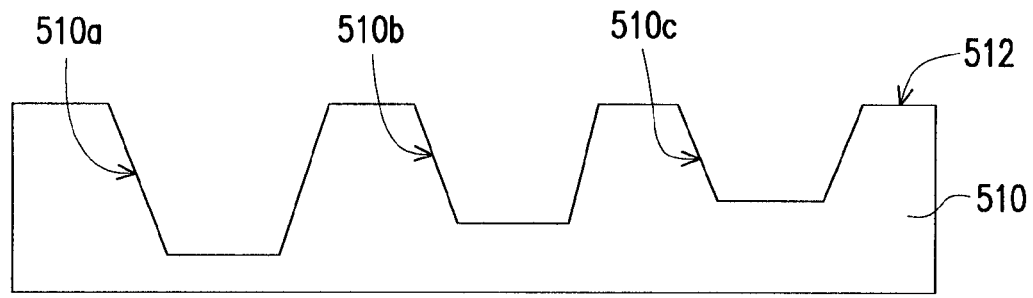
FIG. 12A to FIG. 12F are flow diagrams illustrating a fabricating method of a light emitting element according to another exemplary embodiment.
Figure 12B:
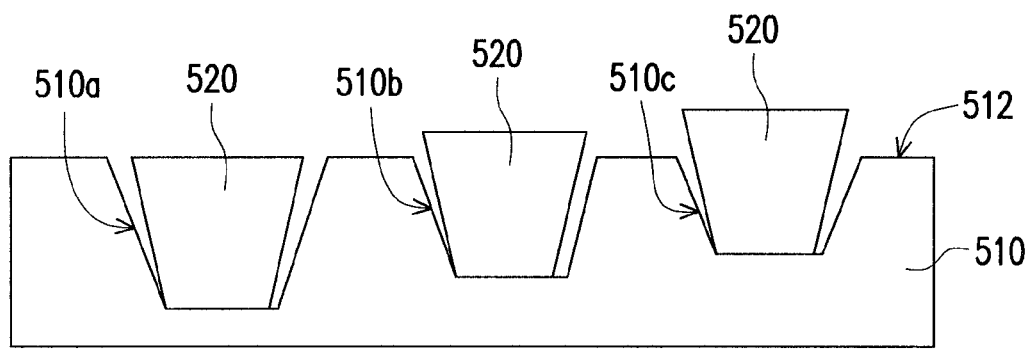

Firstly, as depicted in FIG. 12A, the substrate 510 is provided, and the plurality of first concaves 510a, the plurality of second concaves 510b and the plurality of third concaves 510c on the substrate 510, wherein a depth of the first concaves 510a is greater than a depth of the second concaves 510b, and the depth of the second concaves 510b is greater than a depth of the third concaves 510c. The depth of the first concaves 510a, the depth of the second concaves 510b and the depth of the third concaves 510c are respectively equal or close to a depth of the first light emitting diode chips 520, the depth of the second light emitting diode chips 530 and the depth of the third light emitting diode chips 54. Next, as depicted in FIG. 12B, the plurality of first light emitting diode chips 520, such as the red light emitting diode chips, is moved onto the substrate 510. Now, a portion of the first light emitting diode chips 520 go into the first concaves 510a, a portion of the first light emitting diode chips 520 go into the second concaves 510b and protrudes out of a surface 512 of the substrate 510, and a portion of the first light emitting diode chips 520 go into the third concaves 510c and protrudes out of a surface 512 of the substrate 510.

Figure 12C:
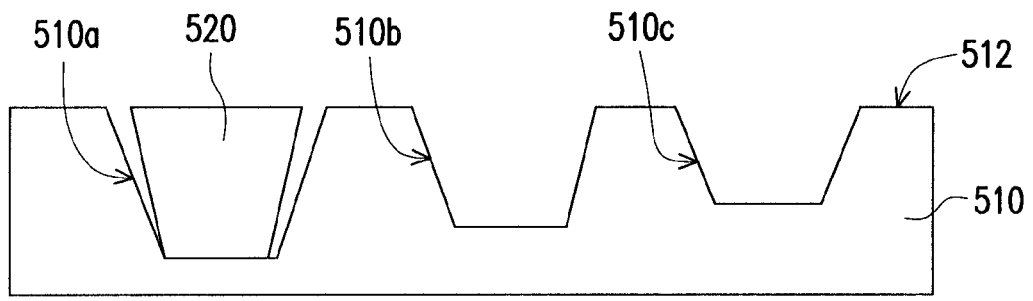
Figure 12D:
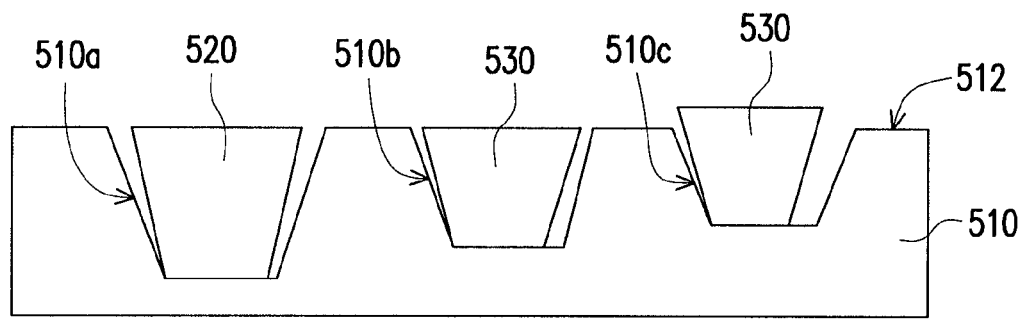
Figure 12E:
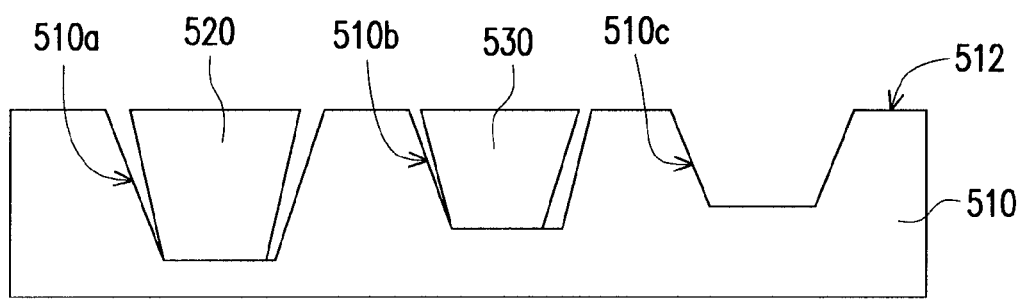
Figure 12F:
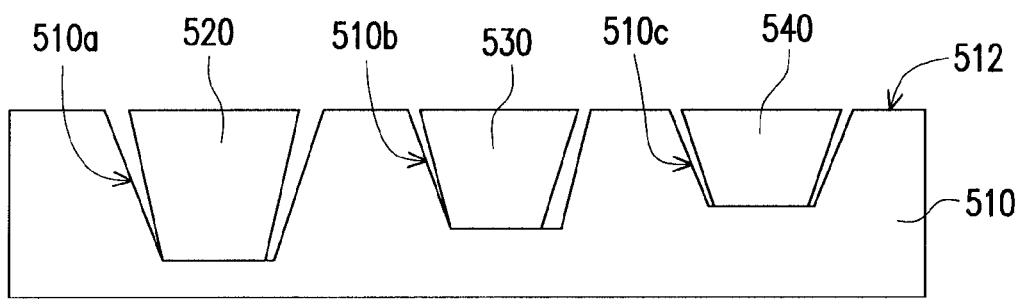

As depicted in FIG. 12C, the first light emitting diode chips 520 protruded out of the surface 512 of the substrate 510 are removed. Then, as depicted in FIG. 12D, the plurality of second light emitting diode chips 530, such as the blue light emitting diode chips, is moved onto the substrate 510. Now, a portion of the second light emitting diode chips 530 go into the second concaves 510b, a portion of the second light emitting diode chips 530 go into the third concaves 510c and protrudes out of a surface 512 of the substrate 510. Next, as depicted in FIG. 12E, the second light emitting diode chips 530 protruded out of the surface 512 of the substrate 510 are removed. Then, as depicted in FIG. 12, the plurality of second light emitting diode chips 540, such as the green light emitting diode chips, is moved onto the substrate 510. Now, the second light emitting diode chips 540 go into the third concaves 510c, and at least partially completed the fabrication of the light emitting element 500. As mentioned above, by using the thicknesses of the light emitting diode chips and the depths of the concaves corresponded thereof as a basis of assembly accuracy of the light emitting diode chips, the assembly accuracy may be enhanced and thereby enhances the throughput.

Figure 13A:
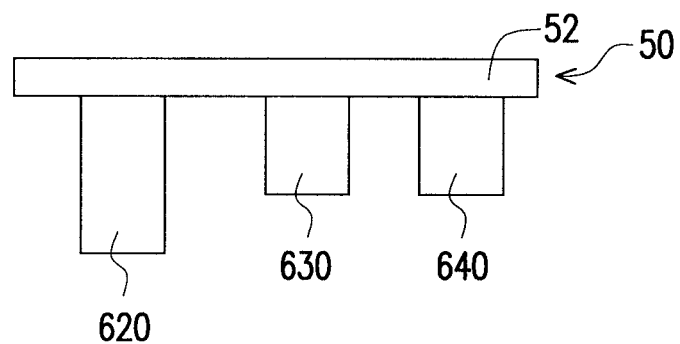
FIG. 13A to FIG. 13E are flow diagrams illustrating a fabricating method of a light emitting element according to yet another exemplary embodiment.

FIG. 13A to FIG. 13E are flow diagrams illustrating a fabricating method of a light emitting element according to yet another exemplary embodiment. Firstly, as depicted in FIG. 13A, a plurality of light emitting diode chip groups 50 is provided. In FIG. 13A, one light emitting diode chip group 50 is schematically illustrated, wherein each light emitting diode chip group 50 includes a carrier board 52, a first light emitting diode chips 620, a second light emitting diode chips 630 and a third light emitting diode chips 640. The first light emitting diode chips 620, the second light emitting diode chips 630 and the third light emitting diode chips 640 respectively are a red light emitting diode chip, a blue light emitting diode chip and a green light emitting diode chip and are disposed on the carrier board 52. A shape of the first light emitting diode chips 620 is different from a shape of the second light emitting diode chips 630 and a shape of the third light emitting diode chips 640.

Figure 13B:
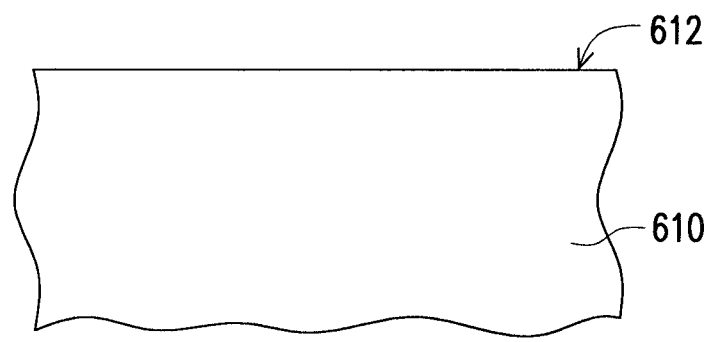
Figure 13C:
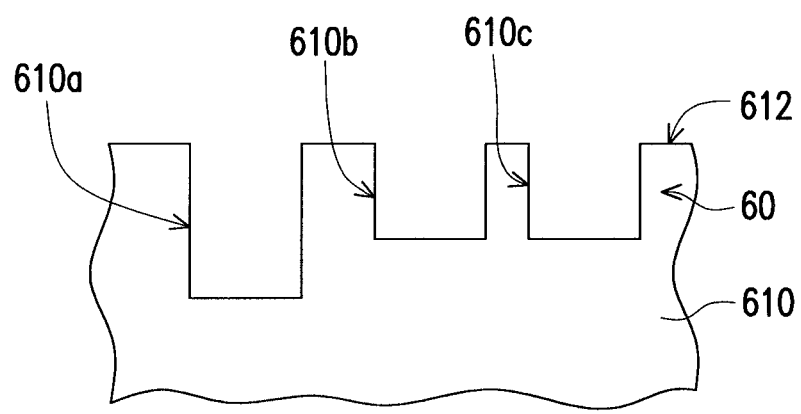
Figure 13D:
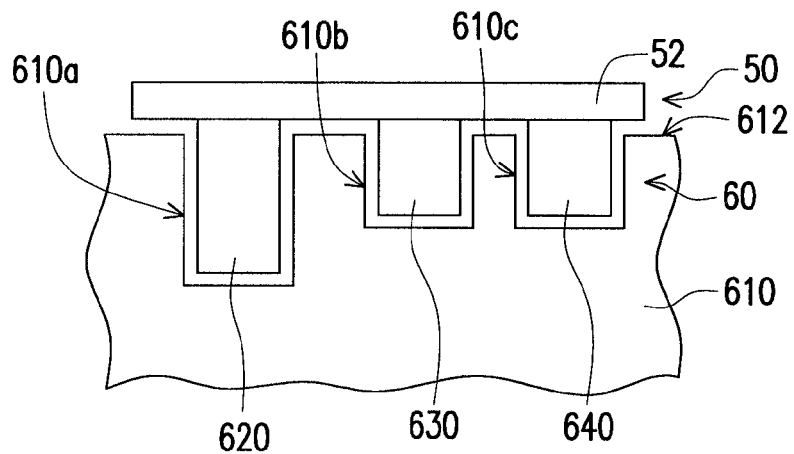

As depicted in FIG. 13B, a substrate 610 is provided, and as depicted in FIG. 13C, a plurality of concave groups 60 (one concave group 60 is schematically illustrated in FIG. 13C) is formed on the substrate 610, wherein each concave group 60 includes a first concave 610a, a second concave 610b and a third concaves 610c, a shape of the first concave 610a is corresponded to the shape of the first light emitting diode chip 620, a shape of the second concave 610b is corresponded to the shape of the second light emitting diode chips 630, and a shape of the third concave 610c is corresponded to the shape of the third light emitting diode chip 640. Next, as depicted in FIG. 13D, the light emitting diode chip group 60 is moved onto the substrate 610, so that the first light emitting diode chip 620, the second light emitting diode chip 630 and the third light emitting diode chip 640 of the light emitting diode chip group 50 respectively go into the first concave 610a, the second concave 610b and the third concave 610c of the concave group 60. After the first light emitting diode chip 620, the second light emitting diode chip 630 and the third light emitting diode chip 640 at the light emitting diode chip group 50 respectively go into the first concave 610a, the second concave 610b and the third concave 610c of the concave group 60, as depicted in FIG. 13E, the carrier board 52 of the light emitting diode chip group 50 is removed, and at least partially completed the fabrication of the light emitting element 600.

Figure 13E:
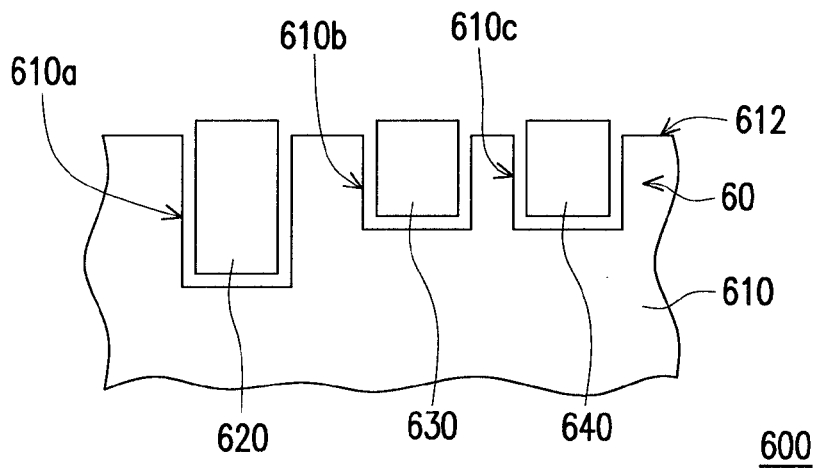
Figure 14:
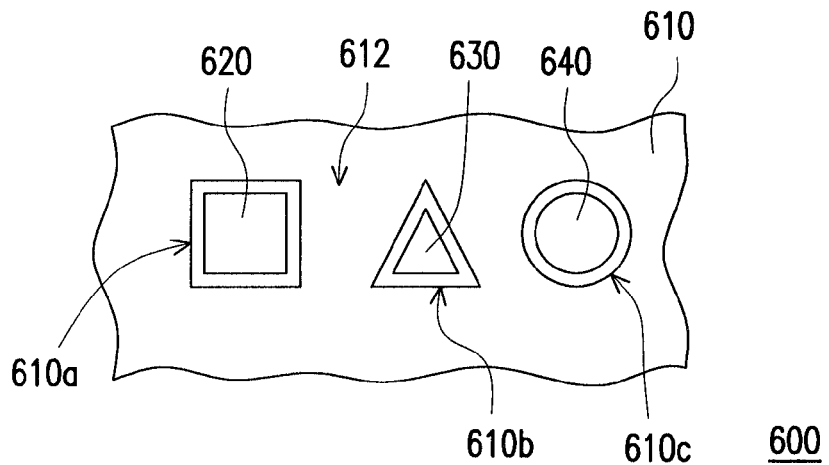
FIG. 14 is a top view of the light emitting element of FIG. 13E.

FIG. 14 is a top view of the light emitting element of FIG. 13E. Referring to FIG. 13E and FIG. 14, in the present embodiment, the first concave 610a, the second concave 610b and the third concave 610c open at a surface 612 of the substrate 610. A method for forming the first concaves 610a, the second concaves 610b and the third concaves 610c includes the following steps. A profile (illustrated as a rectangle in FIG. 14) of the first concave 610a at the surface 612 is corresponded to a profile (illustrated as a rectangle in FIG. 14) of a cross section of the first light emitting diode chip 620. A profile (illustrated as a triangle in FIG. 14) of the second concave 610b at the surface 612 is corresponded to a profile (illustrated as a triangle in FIG. 14) of a cross section of the second light emitting diode chip 630 and different from the profile of the first concave 610a at the surface 612. A profile (illustrated as a circle in FIG. 14) of the third concave 610c at the surface 612 is corresponded to a profile (illustrated as a circle in FIG. 14) of a cross section of the third light emitting diode chip 640 and different from the profile of the first concave 610a at the surface 612 and the profile of the second concave 610b at the surface 612. As a result, the first concave 610a, the second concave 610b and the third concave 610c may respectively have different shapes corresponded to the first light emitting diode chip 620, the second light emitting diode chip 630 and the third light emitting diode chip 640.

In addition, as depicted in FIG. 13A, a thickness of the first light emitting diode chip 620 is greater than a thickness of the second light emitting diode chip 630 and a thickness of the third light emitting diode chip 640. Correspondingly, the method for forming the concave group 60 includes the following steps. As depicted in FIG. 13C, a depth of the first concave 610a equals to the thickness of the first light emitting diode chip 620, a depth of the second concave 610b equals to the thickness of the second light emitting diode chip 630, and a depth of the third concave 610c equals to the thickness of the third light emitting diode chip 640. As such, the first concave 610a, the second concave 610b and the third concave 610c, in addition to having different profiles so as to differ in shapes as depicted in FIG. 14, may also be differ in depths as depicted in FIG. 13C, such that each light emitting diode chip group 50 has a directivity to be used as a basis of assembly accuracy of the light emitting diode chips.

In summary, the first concaves and the second concaves of different volumes are formed on the substrate, and the volume of the first light emitting diode chips and the volume of the second light emitting diode chips are respectively corresponded to the volume of the first concaves and the volume of the second concaves. As a result, when the first light emitting diode chips and the second light emitting diode chips are moved onto the substrate, the first light emitting diode chips selectively go into the first concaves corresponded thereof, and the second light emitting diode chips selectively go into the second concaves corresponded thereof, so as to enable the first light emitting diode chips and the second light emitting diode chips to quickly and correctly be assembled onto the substrate via the automatic alignment, and thereby effectively enhance the throughput of the light emitting element.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light emitting element comprising:
a substrate having a plurality of first concaves and a plurality of second concaves, wherein a volume of each first concave is different from a volume of each second concave, and a depth of each of the first concaves is different from a depth of each of the second concaves;
a plurality of first light emitting diode chips, wherein a volume of each first light emitting diode chip is less than the volume of each first concave, and the first light emitting diode chips are located within the first concaves; and
a plurality of second light emitting diode chips, wherein a volume of each second light emitting diode chip is less than the volume of each second concave, and the second light emitting diode chips are located within the second concaves;
wherein the depth of each of the first concaves is greater than the depth of each of the second concaves, a thickness of each of the first light emitting diode chips is greater than a thickness of each of the second light emitting diode chips, and the thickness of each of the first light emitting diode chips is greater than the depth of each of the second concaves.

2. The light emitting element as recited in claim 1, wherein a shape of each first concave is different from a shape of each second concave.

3. The light emitting element as recited in claim 2 further comprising a plurality of third light emitting diode chips, wherein the substrate further has a plurality of third concaves, a volume of each third concave is different from the volume of each first concave and the volume of each second concave, a volume of each third light emitting diode chip is less than the volume of each third concave, and the third light emitting diode chips are located within the third concaves.

4. The light emitting element as recited in claim 1, wherein an inner wall of each first concave is a cambered surface.

5. The light emitting element as recited in claim 1, wherein an inner wall of each first concave has a reflective layer thereon.

6. The light emitting element as recited in claim 5, wherein each first concave has an electrode therewithin, and the reflective layer is electrically connected to the electrode.

7. The light emitting element as recited in claim 1, wherein each first concave and each second concave open at a surface of the substrate, a profile of each first concave at the surface is corresponded to a profile of a cross section of each first light emitting diode chip, and a profile of each second concave at the surface is corresponded to a profile of a cross section of each second light emitting diode chip and different from the profile of each first concave at the surface.

8. The light emitting element as recited in claim 1, wherein each first concave has a first electrode therewithin, each second concave has a second electrode therewithin, a material of the first electrode is different from a material of the second electrode, the first electrode is adapted to be soldered with a first soldering temperature, and the second electrode is adapted to be soldered with a second soldering temperature.

9. The light emitting element as recited in claim 1, wherein each first light emitting diode chip and the each second light emitting diode chip have optical microstructures thereon.

10. The light emitting element as recited in claim 1, wherein each first concave has an opening terminal and a bottom surface, and each first concave gradually shrinks from the opening terminal toward to the bottom surface.

* * * * *